US007449974B2

(12) United States Patent
Lee et al.

(10) Patent No.: US 7,449,974 B2
(45) Date of Patent: Nov. 11, 2008

(54) ON-CHIP BALUN AND TRANSCEIVER USING THE SAME AND METHOD FOR FABRICATING ON-CHIP BALUN

(75) Inventors: Jae-sup Lee, Yongin-si (KR); Dong-hyun Lee, Anyang-si (KR); Seong-soo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 11/330,104

(22) Filed: Jan. 12, 2006

(65) Prior Publication Data

US 2006/0202776 A1 Sep. 14, 2006

(30) Foreign Application Priority Data

Mar. 11, 2005 (KR) ..................... 10-2005-0020549

(51) Int. Cl.
*H03H 5/00* (2006.01)

(52) U.S. Cl. ......................... 333/25; 336/200; 455/313; 455/323; 455/326

(58) Field of Classification Search .................. 333/25; 336/200; 455/313, 323, 326
See application file for complete search history.

(56) References Cited

U.S. PATENT DOCUMENTS 6,711,395 B1 * 3/2004 Tonegawa et al. ........... 455/313
6,882,263 B2 * 4/2005 Yang et al. .................. 336/200
2003/0146816 A1 * 8/2003 Furumiya et al. ........... 336/200
2005/0128038 A1 * 6/2005 Hyvonen .................... 336/182

* cited by examiner

*Primary Examiner*—Benny Lee
*Assistant Examiner*—Eric R Hamill
(74) *Attorney, Agent, or Firm*—Sughrue Mion, PLLC

(57) ABSTRACT

Provided are an on-chip balun, a transceiver using the on-chip balun, and a method for fabricating the on-chip balun. The on-chip balun includes: a first metal winding including a port grounded and a port to which an unbalanced signal is input; a second winding outputting an induced current generated by the first metal winding as two signals having about equal intensity and a phase difference of about 180°; and a ground shield positioned between the first and second metal windings and having a symmetric structure so as to generate a symmetric parasitic capacitance between the ground shield and the second metal winding. The ground shield can be inserted between the first and second metal windings to remove an asymmetrical parasitic capacitance so as to reduce a phase imbalance and a gain imbalance of an output value of the second metal winding. As a result, a highly balanced on-chip balun can be fabricated.

11 Claims, 8 Drawing Sheets

ON-CHIP BALUN AND TRANSCEIVER USING THE SAME AND METHOD FOR FABRICATING ON-CHIP BALUN

CROSS-REFERENCE TO RELATED APPLICATIONS

This application claims the benefit of Korean Patent Application No. 2005-20549, filed on Mar. 11 2005, in the Korean Intellectual Property Office, the disclosure of which is incorporated herein by reference.

BACKGROUND OF THE INVENTION

1. Field of the Invention

The present invention relates to an on-chip balun, a transceiver using the same, and a method for fabricating the on-chip balun, and more particularly, to an on-chip balun having a phase imbalance and a gain imbalance, a transceiver using the same, and a method for fabricating the on-chip balun.

2. Description of the Related Art

Base stations and radio stations use radio frequency (RF) transmitters including balanced and unbalanced transmission lines in wireless networks for use with receivers such as pagers, mobile phones, personal digital assistants (PDAs), or the like. In general, a Balanced-to-Unbalanced network (balun) is used to couple a balanced circuit to an unbalanced circuit. In other words, the balun converts an unbalanced signal into balanced differential signals and outputs the balanced differential signals. Also, a balun having an on-chip form is often used to match impedances between amplifiers.

FIGS. 1A through 1C are views illustrating a conventional transformer balun. FIG. 1A is a cross-sectional view of the conventional transformer balun, FIG. 1B is a view illustrating a first winding 35 of the conventional transformer balun, and FIG. 1C is a view illustrating a second winding 25 of the conventional transformer balun.

Referring to FIG. 1A, the conventional transformer balun includes the first and second windings 35, 25 sequentially formed above a first insulator 11. A second insulator 13 is formed between the first insulator 11 and the second winding 25, and third and fourth insulators 15, 17 are formed between the first and second windings 35, 25.

Referring to FIGS. 1B and 1C, one of two ports of the first winding 35 formed on the fourth insulator 17 is grounded, and an unbalanced signal is input to the other port. A magnetic field is induced around the first winding 35 due to a current flowing in the first winding 35, and induced current flows in the second winding 25 due to the induced magnetic field. Since an intermediate point of the second winding 25 is grounded, a current output from one of two ports of the second winding 25 and a current output from the other one of the two ports of the second winding 25 have the same intensity but have a phase difference of 180°. Here, the first and second windings 35, 25 are symmetric.

However, a parasitic capacitance occurs between the first and second windings 35 and 25 of the conventional transformer balun. Here, the parasitic capacitance occurring between the first and second windings 35, 25 is an asymmetrical parasitic capacitance causing two differential signals converted in the second winding 25 to be asymmetrical. Thus, a signal having a phase imbalance and a gain imbalance is generated in the conventional transformer balun. In other words, a phase difference between differential signals generated at the two ports of the second winding 25 is not 180°, and the differential signals have different intensities.

FIG. 2 is a view illustrating another conventional transformer balun. Referring to FIG. 2, the conventional transformer balun includes a substrate 50, an insulating layer 60, a first winding 70, and a second winding 80 formed on the first winding 70.

The conventional transformer balun shown in FIG. 2 is different from the conventional transformer balun shown in FIG. 1 in that the first wining 70 is positioned underneath the second winding 80, and the first and second windings 70, 80 are asymmetrical. A port of the first winding 70 is grounded, and an unbalanced signal is input to a port 71 of the first winding 70. Here, a ground line may be formed by forming a viahole in an insulating layer (not shown) formed between the first and second windings 70, 80. Also, an intermediate point of the second winding 80 is grounded, and thus currents flowing through first and second ports 81, 83 of the second winding 80 have the same intensity but have a phase difference of 180°.

However, in such a conventional transformer balun, an asymmetrical parasitic capacitance occurs between the first and second windings 25, 35. Thus, a signal having a phase imbalance and a gain imbalance is generated in the conventional transformer balun.

SUMMARY OF THE INVENTION

Accordingly, the present invention has been made to improve the above-mentioned deficiencies, and aspects of the present invention provide an on-chip balun forming a ground shield between first and second inductors so as to output a signal having a phase imbalance and a gain imbalance, a transceiver using the same, and a method for fabricating the on-chip balun.

According to an aspect of the present invention, there is provided an on-chip balun including: a first metal winding including a grounded port and a port to which an unbalanced signal is input; a second winding outputting an induced current generated by the first metal winding as two signals having about equal intensity and about 180° phase difference; and a ground shield positioned between the first and second metal windings having a symmetric structure so as to generate a symmetric parasitic capacitance between the ground shield and the second metal winding.

An intermediate point of the second metal winding may be an alternating current ground, and an area between one of two ports of the second metal winding and the alternating current ground and an area between an other one of the two ports of the second metal winding and the alternating current ground may be symmetric.

If a frequency of the current induced in the second metal winding is about 5 GHz, a total length of the second metal winding may be less than or equal to about 80 μm.

According to another aspect of the present invention, there is provided a transceiver allowing the on-chip balun to be positioned between an amplifier and a differential mixer so as to use the on-chip balun as a balanced mixer.

According to still another aspect of the present invention, there is provided a method for fabricating an on-chip balun, including: forming a second metal winding having an intermediate point as an alternating current ground; forming a ground shield above the second metal winding, the ground shield being an alternating current ground so as to have a voltage corresponding to a zero ("0") voltage and having a symmetric structure so as to generate a symmetric parasitic capacitance between the ground shield and the second metal winding; and forming a first metal winding above the ground shield, the first metal winding comprising a grounded port and a port to which an unbalanced signal is input.

The method may further include: forming an insulating layer between the second metal winding and the ground shield and forming an insulating layer between the first metal winding and the ground shield.

BRIEF DESCRIPTION OF THE DRAWINGS

The above aspects and features of the present invention will be more apparent by describing exemplary embodiments of the present invention with reference to the accompanying drawings, in which.

DETAILED DESCRIPTION OF EXEMPLARY EMBODIMENTS

Figure 1A:
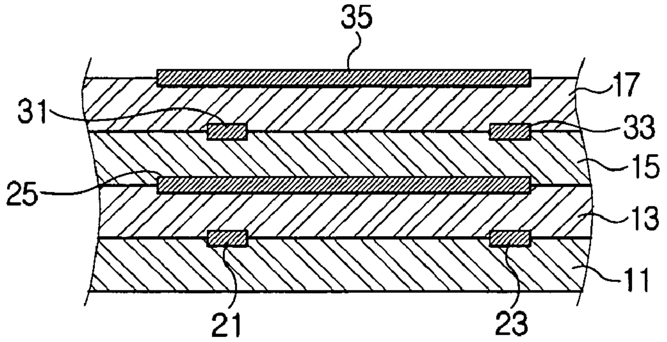
FIG. 1A (PRIOR ART)
FIGS. 1A through 1C are views illustrating a conventional transformer balun.
Figure 1B:
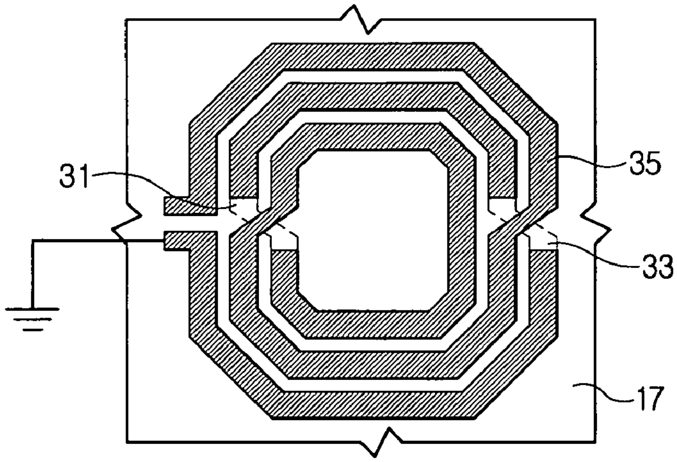
FIG. 1B (PRIOR ART)
Figure 1C:
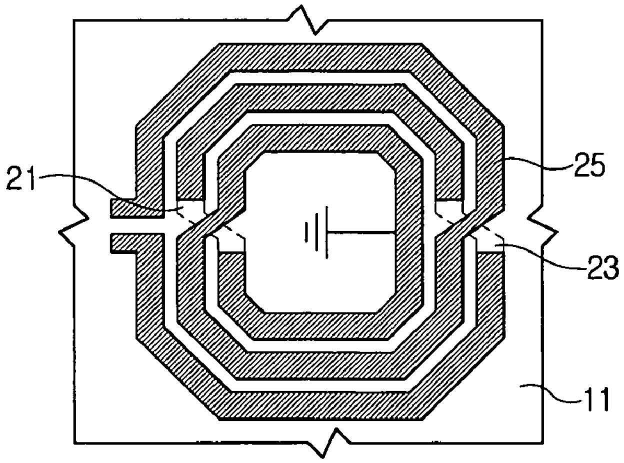
FIG. 1C (PRIOR ART)
Figure 2:
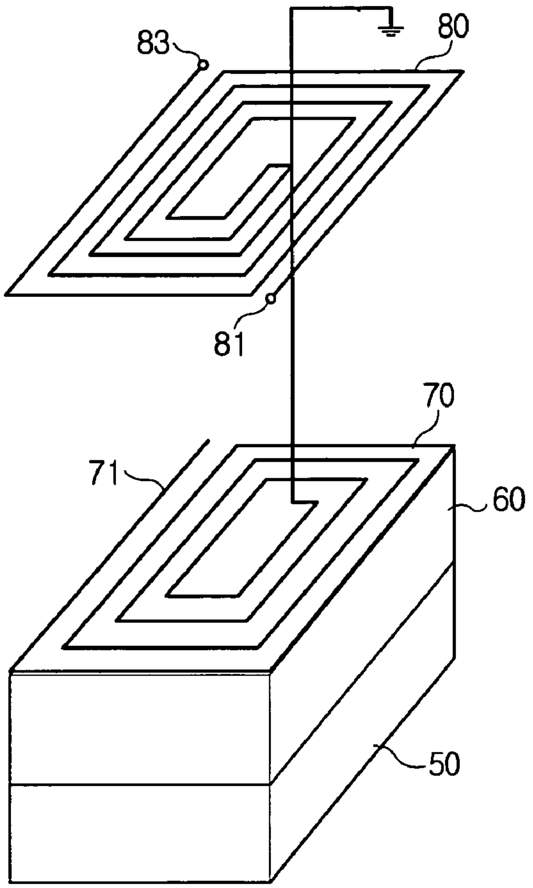
FIG. 2 (PRIOR ART)
FIG. 2 is a view illustrating another conventional transformer balun.

Certain exemplary embodiments of the present invention will be described in greater detail with reference to the accompanying drawings.

In the following description, same drawing reference numerals are used for the same elements even in different drawings. The matters defined in the description are provided to assist in a comprehensive understanding of the invention. Thus, it is apparent that the present invention can be carried out without those defined matters. Also, well-known functions or constructions are not described in detail since they would obscure the invention in unnecessary detail.

Figure 3:
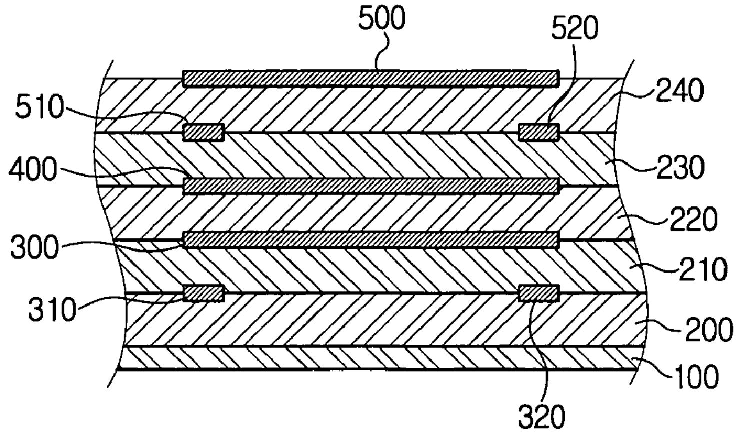
FIG. 3 is a cross-sectional view of an on-chip balun according to an embodiment of the present invention.

FIG. 3 is a cross-sectional view of an on-chip balun according to an exemplary embodiment of the present invention. Referring to FIG. 3, an on-chip balun according to the present invention may include a substrate 100, a first insulating layer 200, a third metal bridge 310, a fourth metal bridge 320, a second insulating layer 210, a second metal winding 300, a third insulating layer 220, a ground shield 400, a fourth insulating layer 230, a first metal bridge 510, a second metal bridge 520, a fifth insulating layer 240, and a first metal winding 500.

A signal input to the first metal winding 500 induces a current in the second metal winding 300 which is output by the second metal winding 300 as two signals having about the same intensity and a phase difference of about 180°. Since the second metal winding 300 may be formed in a spiral, both ends of the second metal winding 300 may be connected to each other through the third and fourth metal bridges 310 and 320. Also, an intermediate point of the second winding 300 may be an alternating current (AC) ground, and an area between a port of the second metal winding 300 and the AC ground and an area between an other port of the second metal winding 300 and the AC ground may be symmetric.

The ground shield 400 may be formed above the second metal winding 300, and a portion of the ground shield 400 may be grounded. The ground shield 400 may be formed between the second metal winding 300 and the first metal winding 300, and may be symmetric with the windings 300, 500.

The first metal winding 500 may be positioned above the ground shield 400. The first metal winding 500 may include a grounded port and a port to which an unbalanced signal is input. Since the first metal winding 500 may be formed in a spiral, both ends of the first metal winding 500 may be connected to each other through the first and second metal bridges 510, 520.

Figure 4A:
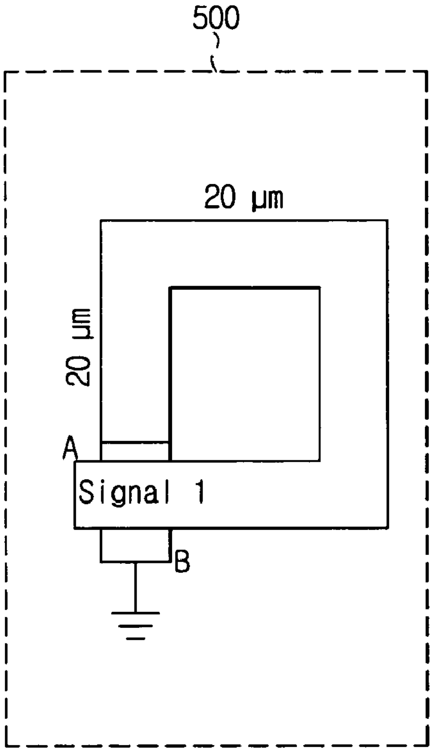
FIGS. 4A through 4C are views illustrating a layout of an on-chip balun according to an embodiment of the present invention.
Figure 4B:
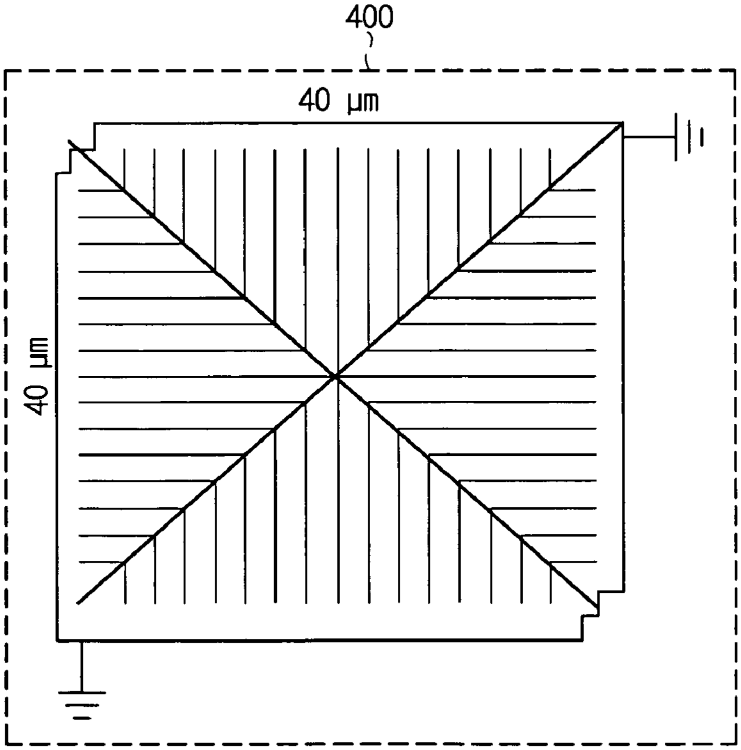
Figure 4C:
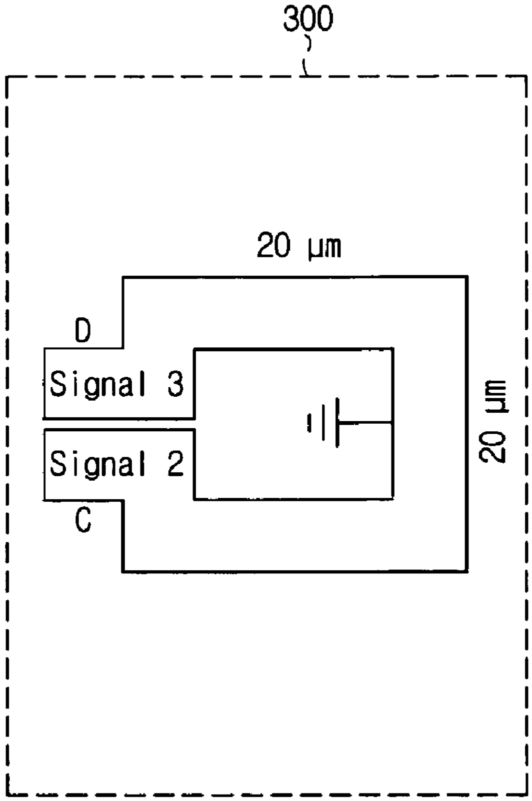

FIGS. 4A through 4C are views illustrating a layout of an on-chip balun according to an exemplary embodiment of the present invention. FIG. 4A illustrates a first metal winding 500, and FIG. 4C illustrates a second metal winding 300 formed under the first metal winding 500. FIG. 4B illustrates a ground shield 400 formed between the first and second metal windings 500, 300.

Referring to FIGS. 4A through 4C, the first and second metal windings 500, 300 may be disposed so as to be symmetric with respect to the ground shield 400 between the first and second metal windings 500, 300. The ground shield 400 may be symmetric and may include at least two ground lines. Since a uniform parasitic capacitance occurs between the second metal winding 500 and the ground shield 400, the ground shield 400 balances a signal input to and/or output from third and fourth ports C and D.

An unbalanced signal is input to a first port A of the first metal winding 500, and a second port B of the first metal winding 500 is grounded. An induced current is generated in the second metal winding 300 due to the first metal winding 500. The induced current generated in the second metal winding 300 is reduced by a symmetric parasitic capacitance between the ground shield 400 and the second metal winding 300, not by a parasitic capacitance between the first and second windings 500, 300.

Thus, since the induced current generated in the second metal winding 300 is uniformly reduced, currents having uniform intensities are output from the third and fourth ports C and D of the second metal winding 300. Also, an intermediate point of the second metal winding 300 is an AC ground, an area between the third port C and the AC ground and an area between the fourth port D and the AC ground may be symmetric, and a phase difference of currents output from the third and fourth ports C and D is about 180°.

Figure 5:
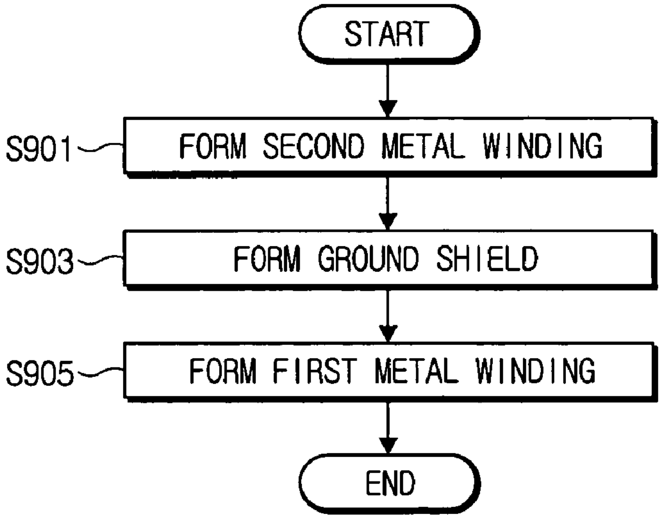
FIG. 5 is a flowchart of a method for fabricating an on-chip balun according to an embodiment of the present invention.

FIG. 5 is a flowchart of a method for fabricating an on-chip balun according to an exemplary embodiment of the present invention. Referring to FIG. 5, in operation S901, a second metal winding 300 is formed above a substrate 100 on which a first insulating layer 200 has been formed. Here, the second metal winding 300 may include two ports outputting two balanced signals having about the same intensity and a phase difference of about 180°. Also, an intermediate point of the second metal winding 300 is an AC ground, and an area between the AC ground and one of the two ports of the second metal winding 300 and an area between the AC ground and the other one of the two ports of the second metal winding 300 may be symmetric.

The on-chip balun according to the present invention may be applied to an ultra-wide band (UWB) having a bandwidth between 3 GHz and 5 GHz. For a frequency of 5 GHz, the second metal winding 300 may be formed so that a total length of the second metal winding 300 is less than 80 μm. In other words, the second metal winding 300 may be formed so that each side of the second metal winding 300 is 20 μm. If the length of the second metal winding 300 is more than or equal to a predetermined length, an imbalance of a signal output from the second metal winding 300 may be increased.

For a frequency of 5 GHz and a dielectric constant of the first insulating layer 200 of "4, " the total length of the second metal winding 300 must be 80 μm so that a phase imbalance is less than 1°. Here, a length of a wavelength can be calculated as in Equation 1:

$$\lambda = c'/f = (c/2)/5 = 30\text{ mm} = 360° \quad (1)$$

wherein λ denotes a length of a wavelength, c' denotes a light speed in a material having a dielectric constant of "4, " f denotes a frequency, and c denotes a light speed in a vacuum state. Thus, the length of the wavelength is 30 mm and corresponds to 360°. As a result, a length corresponding to 1° can be calculated as in Equation 2:

$$l = \lambda/360° = 30\text{ mm}/360° = 83.3\ \mu\text{m} \quad (2)$$

wherein l denotes a length corresponding to 1°, and λ denotes a length of a wavelength. As shown in Equation 2, the total length of the second metal winding 300 must be less than 83.3 μm so that an output value of the second metal winding 300 has a phase imbalance less than 1°.

In operation S903, a ground shield 400 is formed above the second metal winding 300. A third insulating layer 220 may be formed on the second metal winding 300, and then the ground shield 400 may be formed on the third insulating layer 220. Here, the ground shield 400 may have a symmetric structure and a symmetric point forming an AC ground.

In operation S905, a first metal winding 500 may be formed above the ground shield 400. A fourth insulating layer 230 may be formed on the ground shield 400, and then the first metal winding 500 may be formed above the fourth insulating layer 230. Here, the first metal winding 500 may be formed in a spiral and may be symmetric or asymmetric. The first metal winding 500 may also include a port to which an asymmetrical signal is input and a grounded port.

It has been described that the second metal winding 300, the ground shield 400, and the first metal winding 500 may be sequentially stacked. However, the on-chip balun may be formed so as to sequentially stack the first metal winding 500, the ground shield 400, and the second metal winding 300.

Figure 6A:
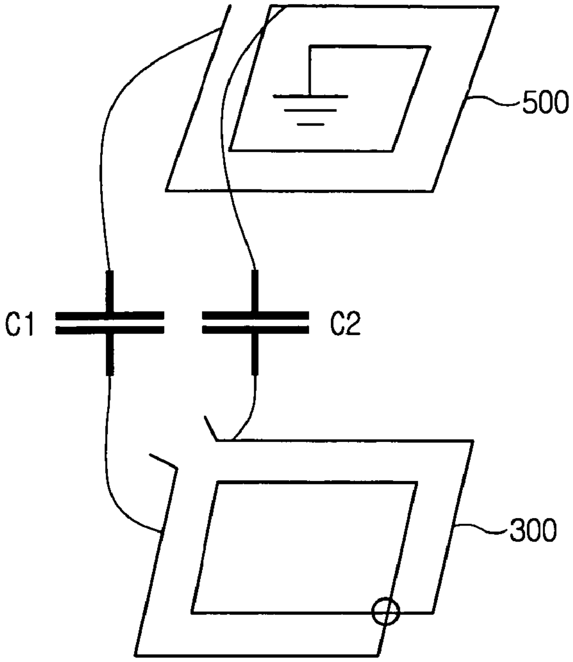
FIGS. 6A and 6B are views illustrating a parasitic capacitance occurring in an on-chip balun according to an embodiment of the present invention.
Figure 6B:
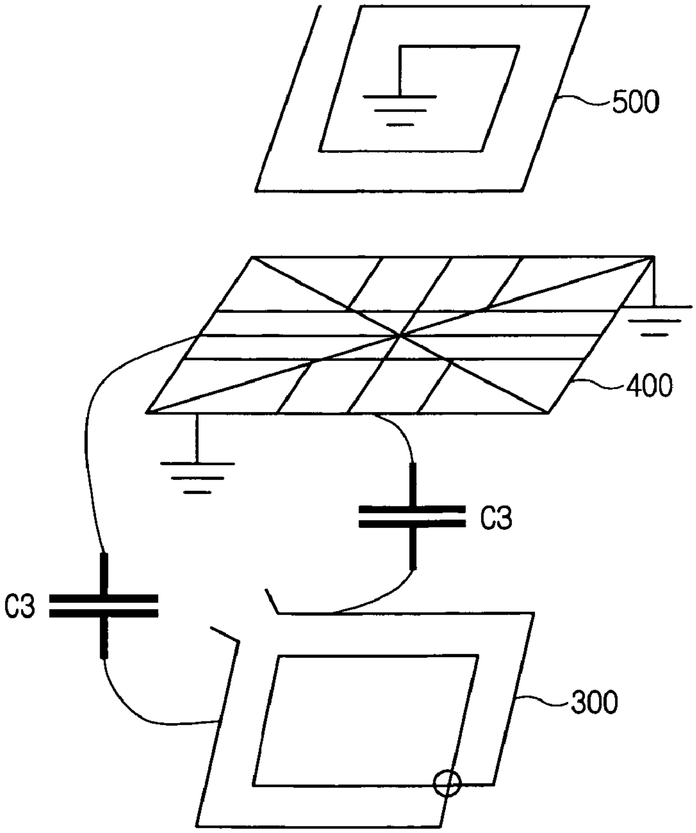

FIGS. 6A and 6B are views illustrating a parasitic capacitance in an on-chip balun. FIG. 6A is a view illustrating a case where the ground shield 400 is not formed between the first and second metal winding 500, 300, and FIG. 6B is a view illustrating a case where the ground shield 400 is formed between the first and second metal windings 500, 300 according to an exemplary embodiment of the present invention.

Referring to FIG. 6A, in a case where the ground shield 400 is not formed between the first and second metal windings 500, 300, a parasitic capacitance occurs between the first and second metal windings 500, 300. Thus, different parasitic capacitances occur in the same position in which an area between the AC ground and one of two ports of the second metal winding 300 and an area between the AC ground and the other one of the two ports of the second metal winding 300 are symmetric with respect to the AC ground of the second metal winding 300. In other words, an asymmetrical parasitic capacitance occurs between the first and second metal windings 500, 300. Thus, the two ports of the second metal winding 300 output currents that have different intensities and do not have a phase difference of 180°.

Referring to FIG. 6B, in a case where the ground shield 400 is formed between the first and second metal windings 500, 300, a parasitic capacitance occurs between the ground shield 400 and the second metal winding 300. Thus, the same parasitic capacitance occurs in the same position in which the area between the AC ground and the one of the two ports of the second metal winding 300 and the area between the AC ground and the other one of the two ports of the second metal winding 300 are symmetric with respect to the AC ground of the second metal winding 300. As a result, the two ports of the second metal winding 300 may output signals having about the same intensity and a phase difference of about 180°.

Figure 7A:
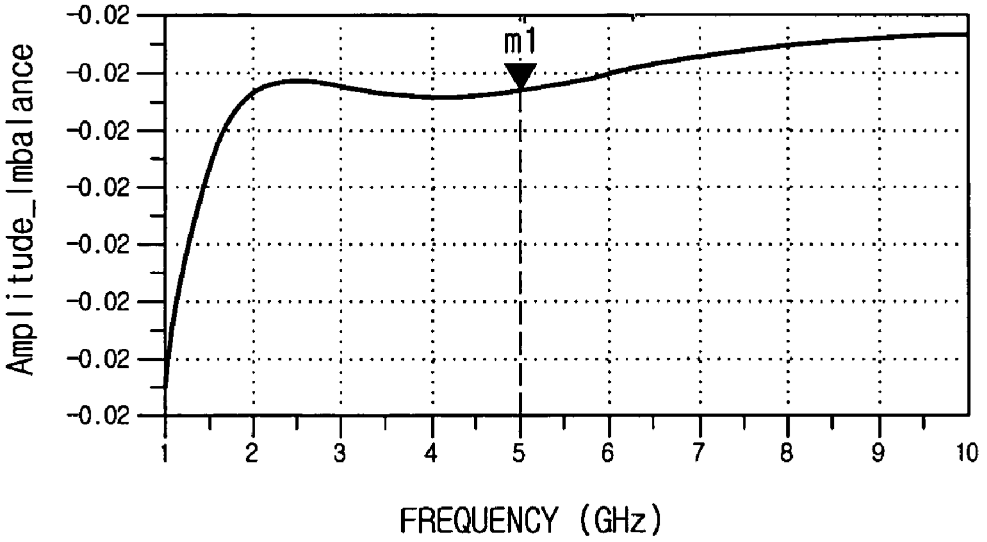
FIGS. 7A through 7D are graphs illustrating a phase imbalance and a gain imbalance of an on-chip balun according to an embodiment of the present invention.
Figure 7B:
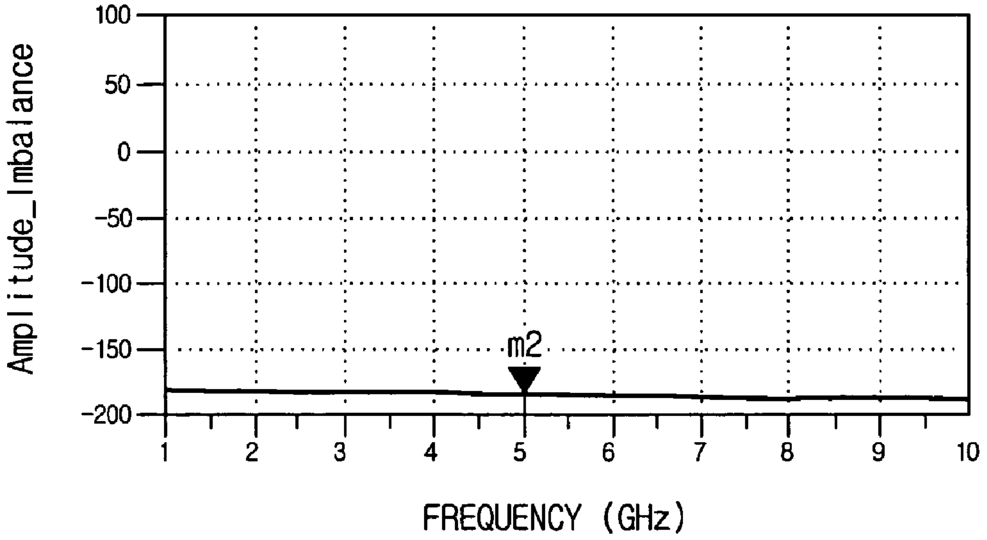
Figure 7C:
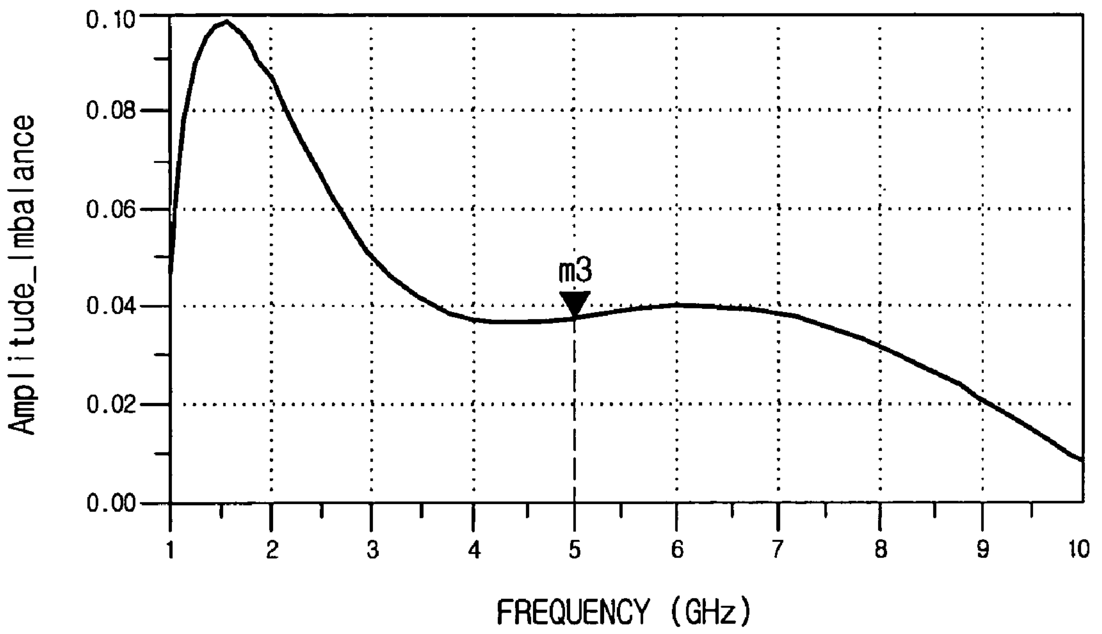
Figure 7D:
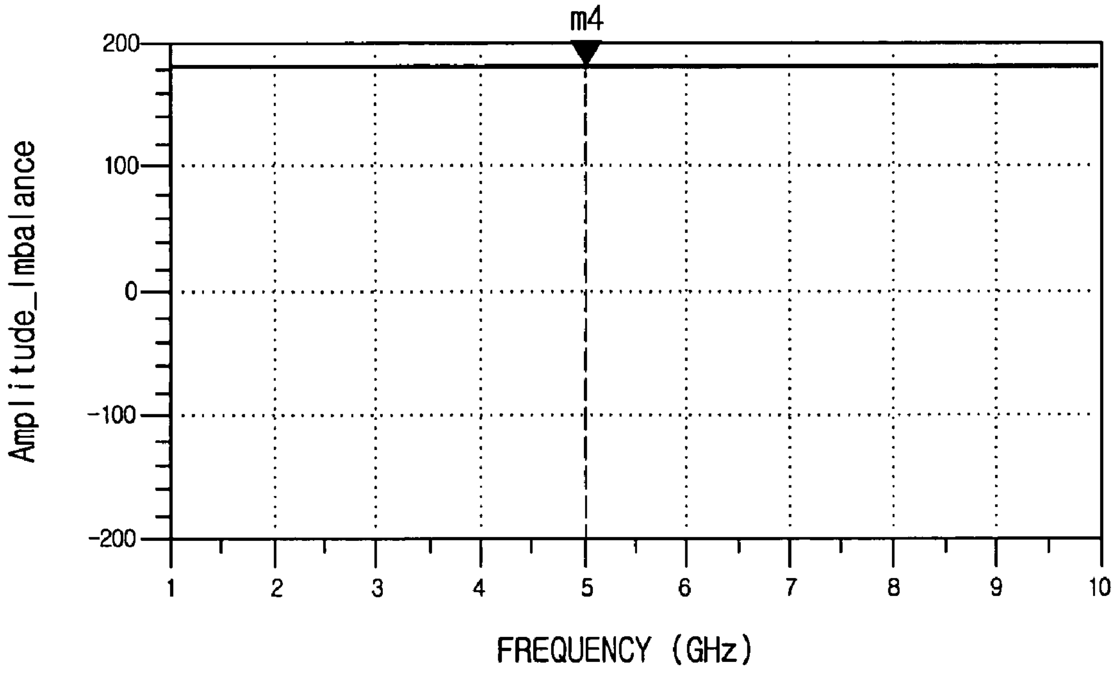

FIGS. 7A through 7D are graphs illustrating a phase imbalance and a gain imbalance of an on-chip balun. FIGS. 7A and 7B are graphs illustrating a gain imbalance and a phase imbalance in the second metal winding 300 when the ground shield 400 is not positioned between the first and second metal windings 500, 300. FIGS. 7C and 7D are graphs illustrating the gain imbalance and the phase imbalance in the second metal winding 300 when the ground shield 400 is positioned between the first and second metal windings 500, 300 according to an exemplary embodiment of the present invention.

Referring to FIGS. 7A and 7B, in a case where the ground shield 400 does not exist and a frequency is 5.000 GHz, the gain imbalance is 0.045 and corresponds to about 26.9 dB(m1) and the phase imbalance is 184.14(m2) and corresponds to 4.14°.

Referring to FIG. 7C and 7D, in a case where the ground shield 400 exists and the frequency is 5.000 GHz, the gain imbalance 0.038 and corresponds to about −28.4 dB(m3) and the phase imbalance is 180.929(m4) and corresponds to 0.929°.

Accordingly, in a case where the ground shield 400 is positioned between the first and second metal windings 500, 300, a parasitic capacitance occurring between the second metal winding 300 and the ground shield 400 may be uniformly maintained so as to reduce the gain imbalance and the phase imbalance. The phase imbalance is less than 1°, and the gain imbalance is less than 1 dB. In particular, when the ground shield 400 is used, the phase imbalance is more sharply reduced than when the ground shield 400 is not used.

Figure 8:
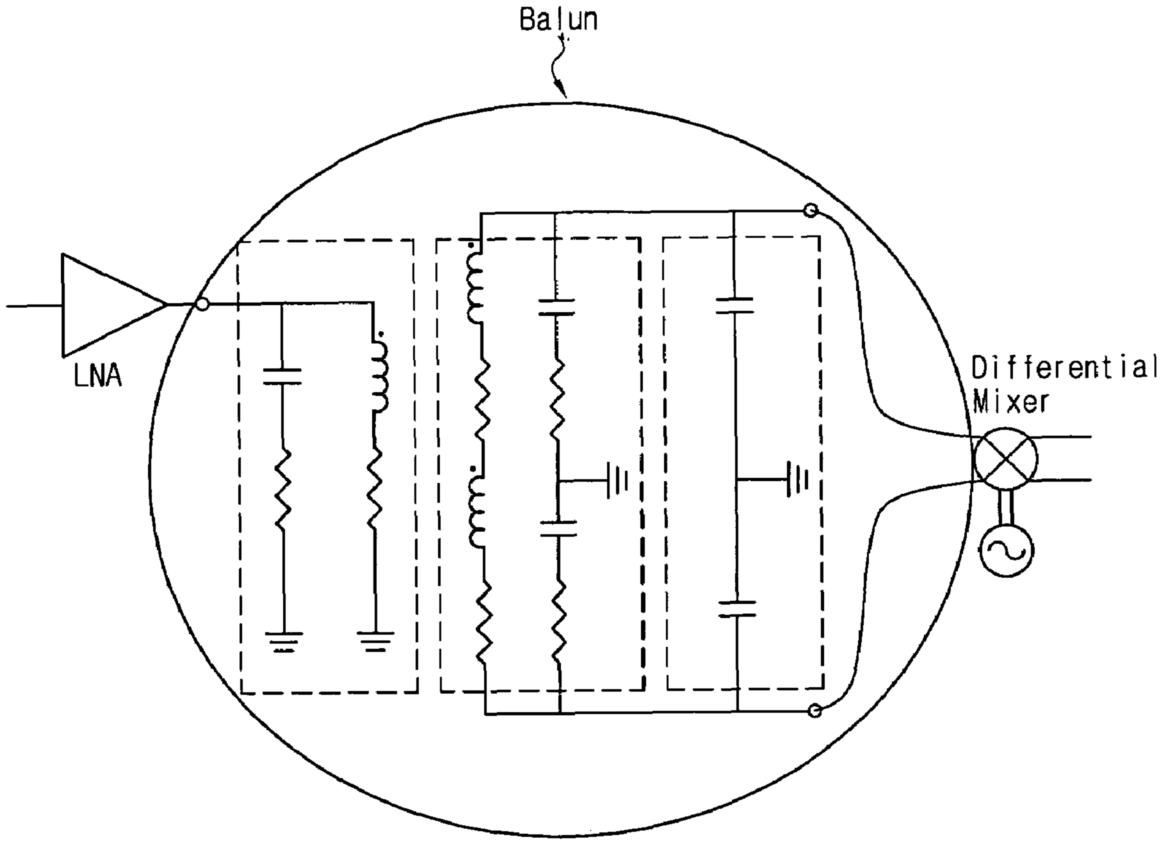
FIG. 8 is a view illustrating a transceiver to which an on-chip balun is applied according to an embodiment of the present invention.

FIG. 8 is a view illustrating a transceiver adopting an on-chip balun according to an exemplary embodiment of the present invention. Referring to FIG. 8, a first metal winding 500 of an on-chip balun used in a transceiver may be connected to an output node of a single-ended low noise amplifier (LNA). The second metal winding 300 may also be connected to an input node of a differential mixer. Here, the on-chip balun is used as a balanced mixer converting an unbalanced signal into a balanced signal.

As described above, in an on-chip balun, a transceiver using the on-chip balun, and a method for fabricating the on-chip balun according to the present invention, a ground shield may be inserted between first and second metal windings so as to remove an asymmetrical parasitic capacitance. Thus, a phase imbalance and a gain imbalance of an output value of the second metal winding can be reduced. As a result, a highly balanced on-chip balun can be fabricated.

The foregoing embodiment and advantages are merely exemplary and are not to be construed as limiting the present invention. The present teaching can be readily applied to other types of apparatuses. Also, the descriptions of the embodiments of the present invention are intended to be illustrative, and not to limit the scope of the claims, and many alternatives, modifications, and variations will be apparent to those skilled in the art.

What is claimed is:

1. An on-chip balun, comprising:

a first metal winding comprising a grounded port and a port to which an unbalanced signal is input;

a second metal winding outputting an induced current generated by the first metal winding as two signals having about identical intensity and a phase difference of about 180°; and a ground shield positioned between the first and second metal windings and having a symmetric structure so as to generate a symmetric parasitic capacitance between the ground shield and the second metal winding, wherein a total length of the second metal winding is less than or equal to (c/2)/(f*360), where f is a frequency and c is the speed of light in a vacuum.

2. The on-chip balun of claim 1, wherein:

an intermediate point of the second metal winding is an alternating current ground; and an area between one of two ports of the second metal winding and the alternating current ground and an area between an other one of the two ports of the second metal winding and the alternating current ground are symmetric.

3. A transceiver comprising the on-chip balun of claim 1, wherein the on-chip balun is a balanced mixer positioned between an amplifier and a differential mixer.

4. An on-chip balun, comprising:

a first metal winding comprising a grounded port and a port to which an unbalanced signal is input;

a second metal winding outputting an induced current generated by the first metal winding as two signals having about identical intensity and a phase difference of about 180°; and a ground shield positioned between the first and second metal windings and having a symmetric structure so as to generate a symmetric parasitic capacitance between the ground shield and the second metal winding, wherein for a frequency of the current induced in the second metal winding of about 5 GHz, a total length of the second metal winding is less than or equal to 80 μm.

5. A method for fabricating an on-chip balun, comprising:

forming a second metal winding having an intermediate point as an alternating current ground;

forming a ground shield above the second metal winding, wherein the ground shield is an alternating current ground comprising a symmetric structure so as to generate a symmetric parasitic capacitance between the ground shield and the second metal winding; and forming a first metal winding above the ground shield, the first metal winding comprising a grounded port and a port to which an unbalanced signal is input, wherein a total length of the second metal winding is less than or equal to (c/2)/(f*360), where f is a frequency and c is the speed of light in a vacuum.

6. The method of claim 5, further comprising:

forming an insulating layer between the second metal winding and the ground shield and an insulating layer between the first metal winding and the ground shield.

7. The method of claim 5, wherein the second metal winding is formed such that:

an area between one of two ports of the second metal winding and the alternating current ground and an area between an other one of the two ports of the second metal winding and the alternating current ground are symmetric.

8. A method for fabricating an on-chip balun, comprising:

forming a second metal winding having an intermediate point as an alternating current ground;

forming a ground shield above the second metal winding, wherein the ground shield is an alternating current ground comprising a symmetric structure so as to generate a symmetric parasitic capacitance between the ground shield and the second metal winding; and forming a first metal winding above the ground shield, the first metal winding comprising a grounded port and a port to which an unbalanced signal is input, wherein the unbalanced signal induces a current in the second metal winding, and wherein for a frequency of the current induced in the second metal winding of about 5 GHz, a total length of the second metal winding is less than or equal to 80 μm.

9. An on-chip balun, comprising:

a first conductive winding;

a second conductive winding symmetric with the first conductive winding and magnetically coupled to the first conductive winding; and a ground shield disposed between the first and second conductive windings;

wherein the ground shield is symmetric with the first and second conductive windings, and wherein a total length of the second conductive winding is less than or equal to 80 μm for a frequency of current induced in the second conductive winding of about 5 GHz.

10. The on-chip balun of claim 9, further comprising:

an insulating layer disposed between the second conductive winding and the ground shield and an insulating layer disposed between the first conductive winding and the ground shield.

11. The on-chip balun of claim 9, wherein the second conductive winding further comprises:

a first port;

a second port; and an intermediate point;

wherein the intermediate point is an alternating current ground; and an area between the first port and the alternating current ground and an area between the second port and the alternating current ground are symmetric.

* * * * *